US010128396B2

(12) United States Patent
Gerardi et al.

(10) Patent No.: US 10,128,396 B2
(45) Date of Patent: Nov. 13, 2018

(54) PHOTOVOLTAIC CELL

(71) Applicant: STMICROELECTRONICS S.r.l., Agrate Brianza (IT)

(72) Inventors: Cosimo Gerardi, Motta S.Anastasia (IT); Cristina Tringali, Catania (IT); Sebastiano Ravesi, Catania (IT); Marina Foti, Catania (IT); NoemiGraziana Sparta', Catania (IT); Corrado Accardi, Ragusa (IT); Stella Loverso, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 983 days.

(21) Appl. No.: 14/055,397

(22) Filed: Oct. 16, 2013

(65) Prior Publication Data

US 2014/0116501 A1    May 1, 2014

(30) Foreign Application Priority Data

Oct. 26, 2012 (IT) ................ VI2012A0290

(51) Int. Cl.
*H01L 31/00* (2006.01)
*H01L 31/075* (2012.01)
*H01L 31/0376* (2006.01)
*H01L 31/0392* (2006.01)
*H01L 31/18* (2006.01)
*H01L 31/20* (2006.01)

(52) U.S. Cl.
CPC ...... *H01L 31/075* (2013.01); *H01L 31/03762* (2013.01); *H01L 31/03926* (2013.01); *H01L 31/1896* (2013.01); *H01L 31/202* (2013.01); *Y02E 10/548* (2013.01); *Y02P 70/521* (2015.11)

(58) Field of Classification Search
CPC .......... H01L 31/075; H01L 31/03762; H01L 31/03926; H01L 31/1896; H01L 31/202
See application file for complete search history.

(56) References Cited

U.S. PATENT DOCUMENTS 4,388,482 A * 6/1983 Hamakawa ........... H01L 31/075
                                                      136/258
5,140,397 A    8/1992 Haga et al.
5,252,141 A * 10/1993 Inoue ..................... B32B 17/02
                                                      136/251

(Continued)

OTHER PUBLICATIONS

Yu Wei, et al., Hydrogen Dilution Affect on Growth and Optical Properties of Amorphous Silicon (a-Si:H) Film with FTS, Acta Photonica Sinica, 2012 vol. 41 Issue 3 307-310.*

(Continued)

*Primary Examiner* — Shannon M Gardner
(74) *Attorney, Agent, or Firm* — Slater Matsil, LLP

(57) ABSTRACT

A photovoltaic cell may include a hydrogenated amorphous silicon layer including a n-type doped region and a p-type doped region. The n-type doped region may be separated from the p-type doped region by an intrinsic region. The photovoltaic cell may include a front transparent electrode connected to the n-type doped region, and a rear electrode connected to the p-type doped region. The efficiency may be optimized for indoor lighting values by tuning the value of the $H_2/SiH_4$ ratio of the hydrogenated amorphous silicon layer.

19 Claims, 4 Drawing Sheets

(56) References Cited

U.S. PATENT DOCUMENTS

| | | | |
|---|---|---|---|
| 6,166,319 | A | 12/2000 | Matsuyama |
| 2005/0229965 | A1 | 10/2005 | Nishimura et al. |
| 2008/0196761 | A1 | 8/2008 | Nakano et al. |
| 2009/0022901 | A1 | 1/2009 | Ray et al. |
| 2009/0079010 | A1 | 3/2009 | DeLoach et al. |
| 2010/0252759 | A1* | 10/2010 | Guler .................. E03D 3/06 251/129.04 |
| 2011/0088760 | A1* | 4/2011 | Sheng ............... H01L 21/0237 136/255 |
| 2011/0174362 | A1 | 7/2011 | Tanner et al. |

OTHER PUBLICATIONS

Grunthaner et al., "Oxygen Impurity Effects at Metal/Silicide Interfaces: Formation of Silicon Oxide and Suboxides in the Ni/Si System," J. Vac. Sci. Technol., 19(3), Sep./Oct. 1981, pp. 641-648.

Metz et al., "Partial Release and Detachment of Microfabricated Metal and Polymer Structures by Anodic Metal Dissolution," Journal of Microelectromechanical Systems, vol. 14, No. 2, Apr. 2005, pp. 383-391.

MacCarthy et al., "A Laser Release Method for Producing Prototype Flexible Retinal Implant Devices," Science Direct, Sensors and Actuators A 132 (2006), pp. 296-301.

Landesberger et al., "Carrier Techniques for Thin Wafer Processing," CS MANTECH Conference, May 14-17, 2007, Austin, Texas, pp. 33-36.

Haskal, "Philips, Flexible Displays for Novel Applications," Nov. 9, 2007, 40 pages.

\* cited by examiner

PHOTOVOLTAIC CELL

TECHNICAL FIELD

The present disclosure relates to the field of semiconductor technology, and more specifically, to an improved photovoltaic cell.

BACKGROUND

In recent years, there have been several developments towards the realization of wireless sensors. A particular advantage of wireless sensors includes that they can be operated without providing an electrical connection. More specifically, it is typical that such wireless sensors are capable of recharging their own batteries by using energy, which does not require cables. One such form of energy is solar energy. In particular, several sensors have been developed that can be recharged via a photovoltaic cell carried thereby. The advantage of such sensors is that they can be deployed with no infrastructure other than a radio frequency (RF) connection for exchanging data with the sensor and alight source for providing power. At the same time, a similar photovoltaic cell can be used to provide power to pocket calculators, watches and several other small electronic devices. While mainstream photovoltaic technology research has been devoted to the optimization of photovoltaic cells for outdoor use, little development has been done for optimization of cells for indoor use.

SUMMARY

The present disclosure has been made in light of this and provides a manufacturing method and the corresponding photovoltaic cell optimized for indoor use. Such a cell can be employed to operate a plurality of electronic devices, such as sensors for indoor use. Additionally, the photovoltaic cell can be advantageously realized on top of a flexible substrate, thereby allowing the photovoltaic cell to be applied on shapes that are not necessarily flat. The present disclosure also provides a manufacturing method for a flexible substrate and the resulting flexible substrate. The flexible substrate can be advantageously used in combination with the photovoltaic cell described above, for example, in the realization of a flexible sensor. However, the flexible substrate can also be used independently of the photovoltaic cell.

The present disclosure'can relate to a photovoltaic cell comprising an hydrogenated amorphous silicon layer including a n-type doped region and a p-type doped region, the n-type doped region being separated from the p-type doped region by an intrinsic region, and a front transparent electrode connected to the n-type doped region and a rear electrode connected to the p-type doped region. The efficiency can be optimized for indoor lighting values by tuning the value of the $H_2/SiH_4$ ratio of the hydrogenated amorphous silicon layer.

This may provide the advantage that efficiency can be increased in a simple manner. Additionally, by tuning the $H_2/SiH_4$ ratio, it is possible to limit recombination of the holes within the intrinsic part of the silicon layers, thereby allowing the usage of a n-i-p approach, wherein the light source faces the n side of the cell. Such approach may be further advantageous since the n-type doped side of the cell combines particularly well with transparent electrode materials.

In some embodiments, the ratio can be in a range from 2 to 10, and such as preferably 5. This may provide the advantage that the recombination of holes is kept under control, while the lowering of the open circuit voltage may be reduced or minimized. In some embodiments, the front transparent electrode can have a work function equal to or lower than that of the n-type doped region. In particular, in some embodiments the front transparent electrode can include a transparent conductive oxide (TCO) layer, such as any of ZnO:Al, ITO, ZnO:B, ZnO:Ga, ZnO(B), $SnO_2$:F. This may provide the advantage that the collection of electrons on the front electrode is highly efficient.

In some embodiments, the rear electrode can have a work function equal to or higher than that of the p-type doped region. In particular, in some embodiments, the rear electrode can include molybdenum and/or tungsten. This may provide the advantage that collection of holes on the rear electrode is highly efficient.

In some embodiments, the hydrogenated amorphous silicon layer can have a thickness in the range of 100 nm to 1000 nm, and such as preferably 300 nm. This may provide the advantage that the absorption of the light is increased or maximized with a minimal impact on the device induced by light degradation.

Furthermore, the present embodiments can relate to a manufacturing method for the photovoltaic cell according to any previous embodiment wherein the ratio is achieved by deposition of the hydrogenated amorphous silicon layer with $SiH_4$ set in a range from 2 standard cubic centimeters per minute (sccm) to 200 sccm, such as preferably 40 sccm, and $H_2$ is set in a range from 2 to 200 sccm, such as preferably 200 sccm.

In some embodiments, deposition can be carried out in a temperature range from 150° C. to 250° C., such as preferably 190° C. This provides the advantage that an optimal ratio $H_2/SiH_4$ ratio can be achieved for efficient operation with indoor lighting.

Moreover, the present disclosure can relate to a flexible sensor comprising at least one sensing element and the photovoltaic cell according to any previous embodiment. Thanks to the high efficiency of the photovoltaic cell, the sensor can achieve reliable operation in an indoor environment.

BRIEF DESCRIPTION OF THE DRAWINGS

The present embodiments will now be described in more detail by way of example hereinafter using advantageous embodiments and with reference to the drawings. The described embodiments are only possible configurations in which the individual features may however, as described above, be implemented independently of each other or may be omitted. Equal elements illustrated in the drawings are provided with equal reference signs. Parts of the description relating to equal elements illustrated in the different drawings may be left out.

DETAILED DESCRIPTION

Interest towards the usage of flexible substrates, as an alternative with respect to the, more standard, rigid silicon substrate for the realization, for example, of displays, photovoltaic panels and various sensors has recently been under intense development. The advantages of flexible substrates include cheaper manufacturing costs, flexibility, shock resistance, etc. It is however challenging to realize semiconductor devices on top of flexible substrates, since the manufacturing equipment usually employed in the manufacturing chain of semiconductor devices is not optimized for such substrates. In particular, it is difficult to provide a flexible substrate, for example, made of plastic, which is compatible with the temperatures, chemicals and physical parameters (for example, high speed spinning) normally used in a semiconductor manufacturing chain.

Figure 1A:
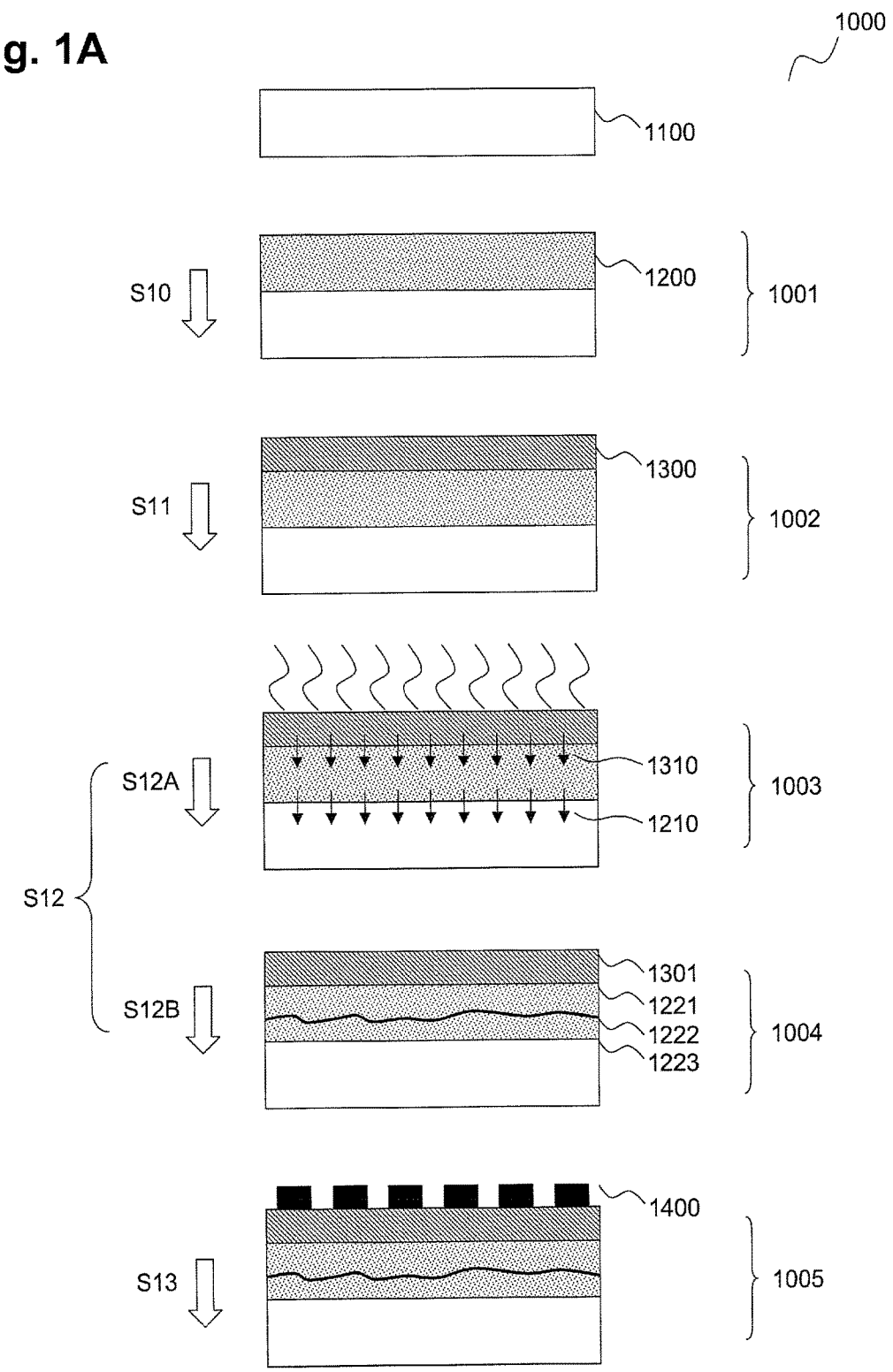
FIGS. 1A and 1B are schematic diagrams of steps for a manufacturing method for a flexible substrate, in accordance with an embodiment of the present disclosure.
Figure 1B:
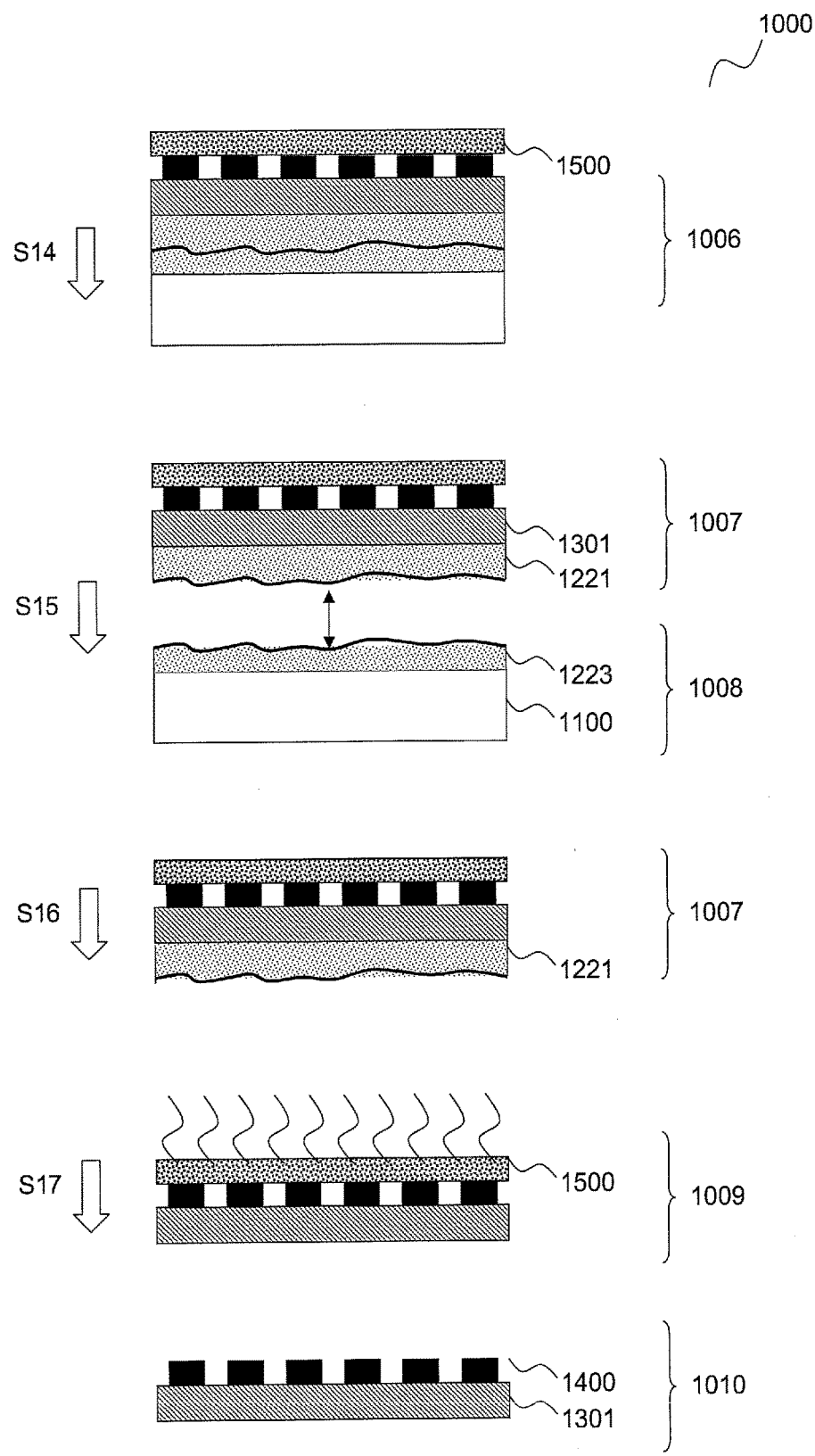

FIGS. 1A and 1B schematically illustrate a manufacturing process 1000 for realizing a flexible substrate 1301. Although in the manufacturing process 1000, the flexible substrate 1301 is described and illustrated as having a plurality of semiconductors devices 1400 on top of it, for example, photovoltaic cells, the present embodiments are not limited thereto, and the flexible substrate 1301 can be realized with other devices on it. Still alternatively, the flexible substrate 1301 can be realized independently of any device on it, for further use for other applications., As can be seen in FIG. 1A, the manufacturing process 1000 starts with a rigid substrate 1100 which could be, for example, a silicon substrate, silicon on a glass substrate, such as silicon on Quartz, or more generally any rigid substrate. Rigid substrate 1100 provides a support for the subsequent manufacturing steps. In a first step S10, an interface material 1200 is deposited onto rigid substrate 1100, thereby realizing structure 1001. The interface material 1200 is nickel, and can be deposited via evaporation or sputtering techniques. The thickness of the interface material 1200 can be in the range of 50 nm to 500 nm, preferably 100 nm. In a subsequent step S11, a precursor material 1300 is deposited on top of structure 1001, thereby realizing structure 1002. The precursor material is polyimide or any polymeric material that can sustain a temperature higher than 150° C. and can be deposited via spin coating. The thickness of the precursor material 1300 can be in the range of 2 μm to 100 μm, according to the material, preferably for example, polyimide at 5 μm.

In step S12, the layer of precursor material 1300 is thermally cured and, at the same time, the structure 1002 is changed such that subsequent detachment of the rigid substrate 1100 therefrom is facilitated. In particular, step S12 comprises two sub steps S12A and S12B. Step S12A includes the heating, or curing, of the precursor material 1300. Step S12B includes the cooling of the structure 1003. Although in the following description several processes such as an interface realization and/or various diffusions are described as being in either of steps S12A or S12B, it will be appreciated by those skilled in the art that this is for illustrative purposes only. For example, while diffusion processes will mostly happen during heating, some diffusion of materials will also happen during the cooling. The same is true for the interface formation.

Step S12A is a curing step carried out in order to cure the precursor material 1300, so as to obtain flexible substrate 1301. When the precursor material is polyimide, heating temperature is in the range of 330° C. to 400° C., preferably 350° C. At the same time, several diffusion processes are happening. In particular, a first diffusion 1210 of interface material 1200 into the rigid substrate 1100 and a second diffusion 1310 of precursor material 1300 into the interface material 1200. The first diffusion 1310 results in a non-reacted layer 1221, while the second diffusion results in a reacted layer 1223. In particular, by using nickel as interface material 1200, polyimide as precursor material 1300, and silicon as the rigid substrate 1100, the nickel diffuses into the silicon thereby creating a layer of nickel silicide as a reacted layer 1223. At the same time, the polyimide degases organic solvents, comprising carbon and oxygen, which diffuse into the nickel, inhibiting the reaction of nickel and silicon, thereby leaving a layer of nickel which does not react with the silicon, as non-reacted layer 1221.

This results in a structure 1004 in which the layer of interface material 1200 is reduced to a non-reacted layer 1221, while the rest of the layer of interface material 1200 reacted with the rigid substrate 1100 forms a reacted layer 1223. During cooling down of the structure 1004 during step S12B, an interface 1222 is therefore fixed between the layers 1221 and 1223. This interface, as will be described below, facilitates the detachment of rigid support 1100 from structure 1004, thereby freeing flexible substrate 1301. In particular, the diffusion happens during heating and the interface formation is during this step. However, the interface is observed only at the end of the whole process including heating and cooling because heating without cooling alone can guarantee diffusion in nickel and interface formation but is not able to assure the correct polymerization of polyimide. Cooling is therefore implemented to guarantee a stable polyimide film to be used as plastic layer for device fabrication.

For the heating step, a heating ramp between 2-4° C./min till final temperature can be used. The final temperature can be in the range of 340-400° C., preferably 360° C. For the cooling step, a negative ramp between 2-4° C./min from the final temperature till room temperature is used.

During an optional step S13, the structure 1004, and in particular the flexible substrate 1310, is used as a base for the manufacturing of semiconductor devices 1400. In particular, the devices 1400 could be photovoltaic cells, as will be described later. However, the present embodiments are not limited thereto, and the devices 1400 could be any sort of semiconductor devices such as, for example, power transistors, displays parts, or any other component, which can be realized in a semiconductor manufacturing process. Still alternatively, the step S13 could be skipped altogether so as to leave the flexible substrate's surface free for subsequent applications. In a further optional step S14, a layer 1500 is applied on top of structure 1005. The layer 1500 could be, for example, an adhesive tape.

However, the present disclosure is not limited thereto and the layer 1500 could be any layer that adheres to the elements adjacent to the layer 1500. For example, layer 1500 could work based on electrostatic attraction between itself and the semiconductor devices 1400 and/or flexible substrate 1301. Alternatively, or in addition, a magnetic attraction between layer 1500 and the semiconductor devices 1400 and/or flexible substrate 1301 can be employed. Layer 1500 improves stability of the flexible substrate 1301 during the subsequent step S15. Alternatively, or in addition, layer 1500 can be used to pull the adjacent elements away from rigid substrate 1100, or to at least assist in the separation of the rigid substrate 1100 from flexible substrate 1301, during step S15.

During a separating step S15, structure 1006 is split into parts 1007 and 1008. In particular, the splitting is obtained along interface 1222. The splitting is obtained through a physical process of mechanical peeling that can be optionally followed by a chemical wet etching of the non-reacted nickel.

During optional step S16, non-reacted layer 1221 is removed from structure 1007. This can be achieved by chemical mechanical polishing (CMP) or a wet etch. In particular, if the non-reacted layer is based on nickel as described above, the wet etch can be achieved by employing, for example, a 1 M solution of ferric chloride ($FeCl_3$) in water (at room temperature). Alternatively, step S16 can be avoided, if the presence of non-reacted layer 1221 on the backside of flexible substrate 1301 is tolerated for the subsequent use of the substrate 1301.

During step S17, the layer 1500 is removed from structure 1009, thereby resulting into structure 1010 via a release process. The release process is a thermal process that can be performed in hot plate for a few seconds or in oven, for minutes, in a range of temperatures between 100° C. and 200° C. It will be appreciated by those skilled in the art that S17 is not necessary when optional step S14 was not carried out.

The manufacturing method 1000 described above thereby results into the flexible layer 1301, with or without additional devices, such as illustrated in structure 1010, realized thereon. The manufacturing process 1000 provides several advantages. In particular, the thermal process S12 allows, in a single step, the curing of precursor material 1300, thereby generating the flexible substrate 1301, and the realization of the interface 1222 that facilitates detachment of the flexible substrate 1301 from the rigid substrate 1100. In this manner, rigid substrate 1100 can also be reused in a further manufacturing cycle, if desired. Additionally, since the interface 1222 is buried between the layers 1221 and 1223, it can be shielded from chemical processes carried out during the realization of the flexible substrate 1301 and/or semiconductor components 1400. Additionally, since the detachment is carried along interface 1222, the manufacturing process 1000 can also be carried out when the flexible substrate 1301 needs to be, at least partially, etched. In particular, the non-reacted layer 1221 can be used as a support for the parts in which the flexible substrate 1301 is removed and/or so as to mask the interface 1222 during the manufacturing process 1000.

Additionally, the present embodiment is applicable to rigid substrates 1100 of any shape and dimension, since the forming of the interface 1222 is carried out vertically, and not from the sides of the structure 1003. Moreover, interface 1222 can be configured such that thermal processes, which are subsequent to the realization of interface 1222, do not alter the chemical and/or physical properties of the interface. In particular, the interface formation is due to polyimide imidization during heating process. After the subsequent cooling process, the polyimide is completely imidized and stable. No more carbon, oxygen or nickel diffusion can start from such stable imidized polyimide. Additionally, since the manufacturing process is rather simple, it does not involve special equipment resulting in additional costs. Moreover, the detachment of structure 1007 from structure 1008 can be carried out rather rapidly, for example, in a few minutes, without specific tooling.

The flexible substrate 1301 can be used independently or as a support for the manufacturing of, for example, photovoltaic cells, as will be described below with reference to FIG. 2. In this case, the manufacturing of the photovoltaic cell can be carried out after the realization of the single flexible substrate 1301, or during the manufacturing thereof, such as illustrated by step S13 in FIG. 1A.

Figure 2:
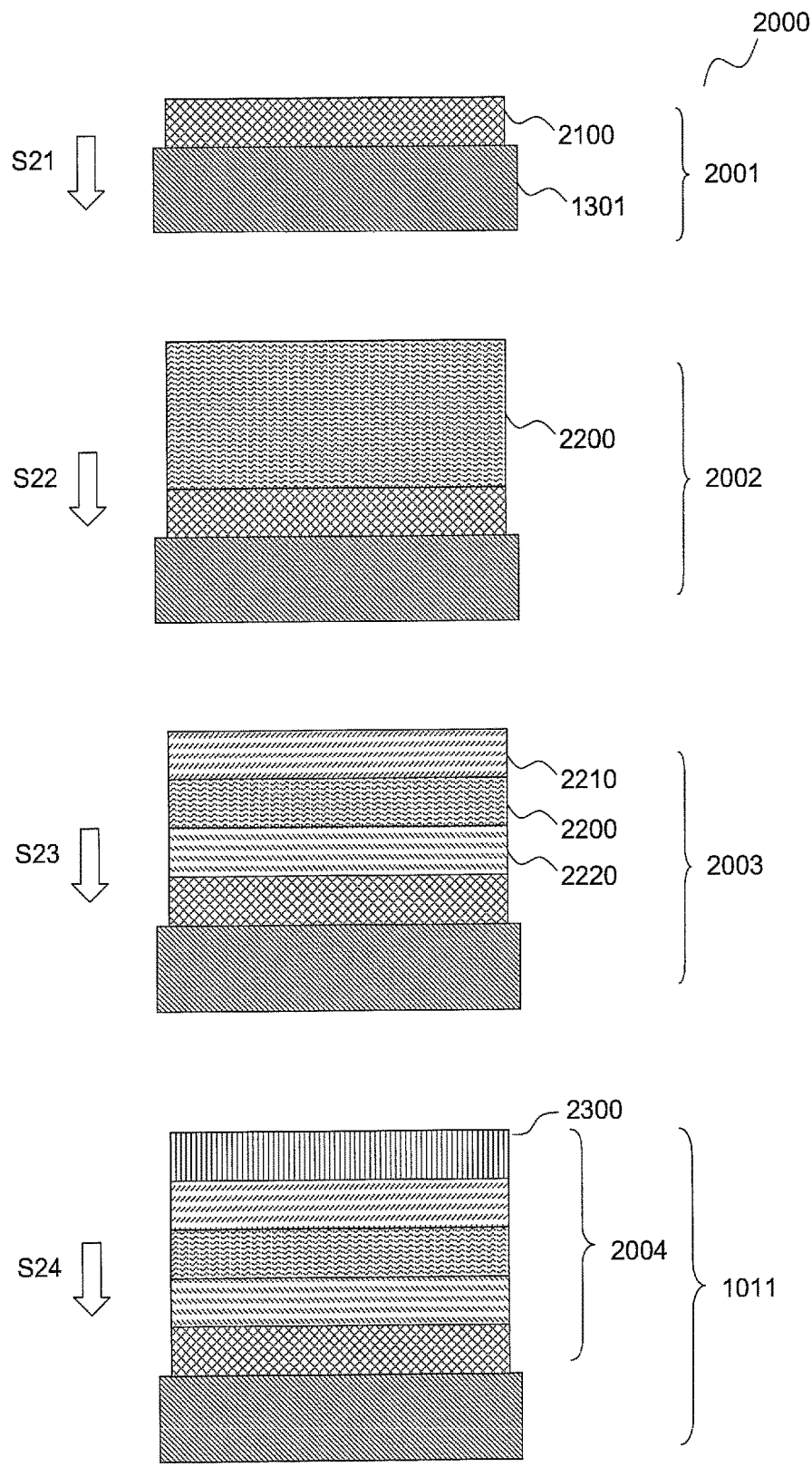
FIG. 2 are schematic diagrams of steps for a manufacturing method for a photovoltaic cell, in accordance with another embodiment of the present disclosure.

FIG. 2 shows a manufacturing method 2000 for a photovoltaic cell in accordance with an embodiment. In the following, the photovoltaic cell will be described as being realized on the flexible substrate 1301 obtained by the manufacturing method 1000 of FIGS. 1A and 1B. However, as discussed above, the present disclosure is not limited thereto and the photovoltaic cell can be realized on any substrate, also rigid ones. In particular, the steps described below, which confer an optimization for indoor lighting to the photovoltaic cell, can be carried out also in the presence of a different substrate.

As can be seen in FIG. 2, a manufacturing method 2000 starts with the deposition on flexible substrate 1301 of a rear electrode 2100 in step S21, thereby realizing a structure 2001. Rear electrode 2100 is any of a molybdenum layer and/or tungsten layer and/or any material with a work function in the range of, preferably higher than, the work function of p-type region 2220. The thickness of rear electrode is in the range of 100 nm to 1000 nm, preferably 800 nm. During a subsequent step S22, a semiconductor layer 2200, having a thickness in the range of 100 nm to 1000 nm, preferably 300 nm, is deposited onto structure 2001. The semiconductor layer 2200 is any of, or any combination of, silicon, CdTe, copper indium gallium selenide ($CuIGaSe_2$, CIGS, CIS), in particular amorphous silicon, even more specifically, it could be a a-Si:H layer. During step S23, semiconductor layer 2200 is doped, with a p-type doping in region 2220 and an n-type doping in region 2210. The thickness of doped region 2210 can be in the range of 10 to 30 nm, preferably 20 nm, and can be obtained by in-situ doping during deposition of the semiconductor, for example, $B_2H_6$ addition into $SiH_4$ and $H_2$ during PECVD for a-Si:H layer. The thickness of doped region 2220 can be in the range of 10 to 30 nm, preferably 20 nm, and can be obtained by in-situ doping during deposition of the semiconductor, for example, by $PH_3$ addition into $SiH_4$ and $H_2$ during PECVD for a-Si:H.

The use of amorphous a-Si:H is advantageous since the material is cost effective and can be deposited on a plurality of substrate materials such as semiconductors, glass, metals, or plastic. Additionally, a-Si:H exhibits good efficiency for indoor applications, since the spectrum of the average indoor light is different from sunlight, and more confined at lower wavelengths. In particular, a typical fluorescence light has a range of 200 to 500 lux, with an average office illumination level at 300 lux. Moreover, the combination of molybdenum and/or tungsten for the rear electrode 2100 with the p-type doped region 2220 of semiconductor layer 2200 is particularly advantageous, due to the good match between the respective work functions. For example, molybdenum has a high work function of 4.9 eV, slightly higher than p-type doped Si at 4.7-4.8 eV, leading to a more favorable contact at the solar cell backside. In addition, molybdenum is refractory and robust against plasma damaging during PECVD growth of a-Si:H.

During a step S24, a front electrode 2300 having a thickness in the range of 300 nm to 2 µm, preferably 900 nm, is deposited onto semiconductor structure 2003, thereby obtaining structure 1011, comprising the flexible substrate 1031 on which the photovoltaic cell 2004, comprising layers 2300, 2210, 2200, 2220, and 2100 is realized. However, as described above, the photovoltaic cell 2004 could be realized on a substrate different from flexible substrate 1301. Front electrode 2300 is a TCO layer, in particular, any of a ZnO:Al (AZO) layer, which has a low cost, or other n-type TCO layers such as ITO, ZnO:B, ZnO:Ga, $SnO_2$:F, or any combination thereof, can be used. The layers are deposited by sputter deposition, or metal-organic CVD (MOCVD), preferably with a low temperature deposition (T<250° C.) For example, the combination of n-AZO and n-type doped region 2210 provides a good contact, since the respective work functions are roughly 3.9 eV and more than 4.2 eV. The same excellent contact characteristics can also be obtained by alternative materials, provided the work function of the front electrode 2300 is in the same range of, or lower than, the work function of n-type doped region 2210.

The photovoltaic cell 2004 so realized provides excellent efficiency characteristics thanks to the excellent contact characteristics, as described above, and thanks to the n-i-p orientation. In particular, the light impinges onto the cell from the side of the front contact and the n-type doped region 2210. Recombination of holes generated in the intrinsic region 2200, before they reach the p-type doped region 2220 is reduced, via a PEVCD process for $SiH_4$ deposition wherein the $H_2/SiH_4$ ratio, hereinafter named R, is tuned as described below.

In particular, the ratio R, is increased in a range of temperatures between 150° C. and 200° C. In some embodiments, the ratio R is in the range from 4 to 10, for example, by having $SiH_4$ set in a range from 2 sccm to 200 sccm, preferably from 2 seem to 100 sccm, more preferably at 40 sccm, $H_2$ set in a range from 2 sccm to 300 sccm, preferably from 2 sccm to 200 sccm, more preferably at 200 sccm, preferably with temperature set at a value in the range from 150° C. to 250° C., preferably 160° C. to 200° C., more preferably 190° C. Such deposition conditions allow increasing of the fraction of nanocrystalline silicon in the amorphous layer. As for the upper limit of the ratio R, a higher ratio R leads to a microcrystalline structure implying a further reduction of the Voc (open circuit voltage) of the photovoltaic cell 2004 and a reduction of the band-gap of the material, for example, from 1.8 eV down to 1.1 eV. In order to limit this, in some embodiments, a range of ratio R can be chosen between 2 and 10, preferably 5. As for the lower limit of the ratio R, for values of R smaller than 2, hole recombination increases to values which affect the performance of the photovoltaic cell.

Figure 3:
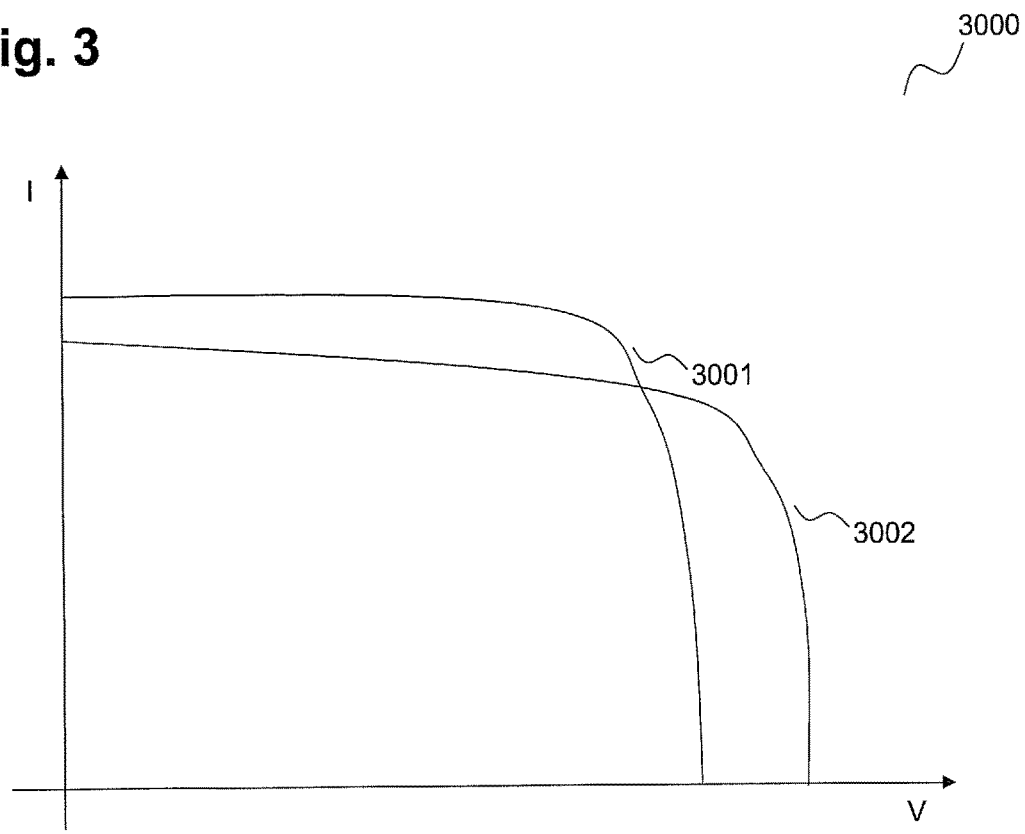
FIG. 3 is a diagram of the current-to-voltage characteristic of two possible realizations of the photovoltaic cell in accordance with embodiments of the present disclosure.

FIG. 3 schematically illustrates the effect of the ratio R on the current to voltage characteristics of the photovoltaic cell. In particular, the Y axis of diagram 3000 illustrates the current while the X axis represents the voltage of the cell. Curve 3001 is realized for an R value, for example, 5, higher than that of curve 3002, for example, 2. As can be seen, curve 3001 has a lower open circuit voltage. However, the higher R value provides a lower recombination with a significant improvement in shunt resistance. Therefore, although the curve with the higher R ratio provides a lower open circuit voltage, its total power output is bigger than for curve 3002. The precise value of R can be chosen, depending on the specific illumination available.

Thanks to the manufacturing method, photovoltaic cell 2004 provides excellent efficiency in indoor applications. In particular, thanks to the intrinsic a-Si:H thickness, for example, in the range of 100 nm to 1000 nm, preferably 300 nm, the improved value for the ratio R, the improved PECVD deposition temperature, in particular, at 190° C., the n-i-p structure in which illumination is received from the n-doped side and thanks to the improved contacts, photovoltaic cells can achieve indoor efficiency at 300 lux F12 of 8% and above. At the same time, the process is robust and cost effective.

Although a single photovoltaic cell has been illustrated, several photovoltaic cells could be realized, preferably next to each other, and connected in series or parallel via scribing, such as laser scribing, or patterning, such as lithographic patterning, techniques.

Accordingly, as described above, the present disclosure achieves an optimization of the performance of the photovoltaic cell for indoor use, in particular, for an F12 light source between 100 and 400 lux, by tuning the $H_2/SiH_4$ ratio R such that efficiency of the cell is maximized. In particular, the tuning can be performed such that the shunt resistance of the photovoltaic cell is maximized. Alternatively, the power output of the cell can be measured and the ratio R can be varied such that power output is maximized with the intended light source.

Thanks to the high efficiency obtained by the photovoltaic cell realized according to the method described above, the cell can be employed to power a plurality of electronic devices, such as watches, pocket calculators and sensors. In particular, sensors such as those included within the scope of the FP7 Interflex standard can be advantageously powered by the photovoltaic cell. Even more advantageously, the photovoltaic cell, in connection with the flexible substrate, can realize a flexible power supply for the sensors mentioned above.

That which is claimed is:

1. A photovoltaic cell comprising:
    a hydrogenated amorphous silicon layer including a first conductivity type doped region, a second conductivity type doped region, and an intrinsic region separating the first conductivity type doped region from the second conductivity type doped region, the intrinsic region physically contacting the first conductivity type doped region and the second conductivity type doped region;
    a front transparent electrode coupled to said first conductivity type doped region; and
    a rear electrode coupled to said second conductivity type doped region,
    wherein a bandgap of the hydrogenated amorphous silicon layer is less than 1.8 eV, and wherein a $H_2/SiH_4$ ratio of said hydrogenated amorphous silicon layer is configured to maximize at least one of a power output or a shunt resistance of the photovoltaic cell during an exposure to a light source between about 100 lux and about 400 lux.

2. The photovoltaic cell according to claim 1 wherein the $H_2/SiH_4$ ratio is between 2 to 10.

3. The photovoltaic cell according to claim 1 wherein said front transparent electrode has a work function equal to or lower than a work function of said first conductivity type doped region.

4. The photovoltaic cell according to claim 1 wherein said front transparent electrode includes a transparent conductive oxide (TCO) layer.

5. The photovoltaic cell according to claim 4 wherein said TCO layer comprises at least one of ZnO:Al, ITO, ZnO:B, ZnO:Ga, and $SnO_2$:F.

6. The photovoltaic cell according to claim 1 wherein said rear electrode comprises at least one of molybdenum and tungsten.

7. The photovoltaic cell according to claim 1 wherein said hydrogenated amorphous silicon layer has a thickness between 100 nm to 1000 nm.

8. The photovoltaic cell according to claim 1 wherein said hydrogenated amorphous silicon layer has a thickness between 100 nm to 300 nm.

9. A sensor device comprising:
    at least one sensing element; and
    a photovoltaic cell configured to power said at least one sensing element and comprising:
    a hydrogenated amorphous silicon layer including a first conductivity type doped region, a second conductivity type doped region, and an intrinsic region separating the first conductivity type doped region from the second conductivity type doped region, wherein the hydrogenated amorphous silicon layer is devoid of an intervening layer between the intrinsic region and the first conductivity type doped region and between the intrinsic region and the second conductivity type doped region;

a front transparent electrode coupled to said first conductivity type doped region; and a rear electrode coupled to said second conductivity type doped region, wherein a bandgap of the hydrogenated amorphous silicon layer is less than 1.8 eV, and wherein a $H_2/SiH_4$ ratio of said hydrogenated amorphous silicon layer is configured to minimize a recombination of charged carriers in the intrinsic region of said hydrogenated amorphous silicon layer during exposure to a light source between 100 lux and 400 lux.

10. The sensor device according to claim 9 wherein the $H_2/SiH_4$ ratio is between 2 to 10.

11. The sensor device according to claim 9 wherein said front transparent electrode has a work function equal to or lower than a work function of said first conductivity type doped region.

12. The sensor device according to claim 9 wherein said front transparent electrode includes a transparent conductive oxide (TCO) layer.

13. A photovoltaic cell, comprising:
a hydrogenated amorphous semiconductor layer comprising:
a first doped region having a first conductivity type;
a second doped region having a second conductivity type different from the first conductivity type; and
an intrinsic region interposed between and in physical contact with each of the first doped region and the second doped region, wherein a bandgap of the hydrogenated amorphous semiconductor layer is less than 1.8 eV, and wherein a $H_2/SiH_4$ ratio of the hydrogenated amorphous semiconductor layer is configured to maximize a power output of the photovoltaic cell when the photovoltaic cell is exposed to a light source having a luminance in a predetermined range.

14. The photovoltaic cell according to claim 13, wherein the first doped region comprises an n-type doped region, and wherein light is configured to impinge on the photovoltaic cell from the n-type doped region.

15. The photovoltaic cell according to claim 13, wherein the predetermined range is between about 100 lux and about 500 lux.

16. The photovoltaic cell according to claim 13, wherein a thickness of the hydrogenated amorphous semiconductor layer is in a range of 100 nm to 1000 nm.

17. The photovoltaic cell according to claim 13, wherein the $H_2/SiH_4$ ratio is between 2 and 10.

18. The photovoltaic cell according to claim 13, wherein the $H_2/SiH_4$ ratio of the hydrogenated amorphous semiconductor layer is further configured to minimize an open-circuit voltage of the photovoltaic cell when the photovoltaic cell is exposed to the light source having the luminance in the predetermined range.

19. The photovoltaic cell according to claim 1, wherein the $H_2/SiH_4$ ratio of the hydrogenated amorphous silicon layer is further configured to minimize an open-circuit voltage of the photovoltaic cell when the photovoltaic cell is exposed to the light source between about 100 lux and about 400 lux.

* * * * *